(12) United States Patent
Radkevich et al.

(10) Patent No.: US 7,862,656 B2
(45) Date of Patent: Jan. 4, 2011

(54) APPARATUS AND METHOD FOR GROWING A CRYSTAL AND HEATING AN ANNULAR CHANNEL CIRCUMSCRIBING THE CRYSTAL

(75) Inventors: Olexy V. Radkevich, Schaumburg, IL (US); Mehmed Becirovic, Elgin, IL (US); Keith Ritter, Addison, IL (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 828 days.

(21) Appl. No.: 11/773,005

(22) Filed: Jul. 3, 2007

(65) Prior Publication Data
US 2009/0007840 A1     Jan. 8, 2009

(51) Int. Cl.
*C30B 15/12* (2006.01)

(52) U.S. Cl. ............... 117/13; 117/20; 117/31; 117/35

(58) Field of Classification Search ............ 117/13, 117/20, 31, 35
See application file for complete search history.

(56) References Cited

U.S. PATENT DOCUMENTS

| | | | |
|---|---|---|---|
| 3,062,821 A | * | 11/1962 | Archer ............... 544/384 |
| 4,203,951 A | | 5/1980 | Goriletsky |
| 4,698,720 A | * | 10/1987 | Finaurini ............... 361/56 |
| 5,069,741 A | * | 12/1991 | Kida et al. ............... 117/31 |
| 5,891,245 A | * | 4/1999 | Atami et al. ............... 117/213 |

* cited by examiner

*Primary Examiner*—Robert M Kunemund
(74) *Attorney, Agent, or Firm*—Peter L. Kendall

(57) ABSTRACT

An apparatus and method is provided for pulling a crystal seed from melt for growing a single crystal. The method includes the steps of providing a crucible and providing within the crucible an outer container, and providing coaxially within the outer container an inner container. A protruding portion of the inner container protrudes downward relative to the outer container for containing melt, the inner and outer containers defining an annular channel therebetween which has a bottom wall and contains introduced charge feed. The method further includes the steps of providing for allowing fluid communication between the annular channel and the inner container, delivering charge feed into the annular channel, and generating heat from within the annular channel for preventing the formation of a condensate of the charge feed within the annular channel.

20 Claims, 2 Drawing Sheets

APPARATUS AND METHOD FOR GROWING A CRYSTAL AND HEATING AN ANNULAR CHANNEL CIRCUMSCRIBING THE CRYSTAL

BACKGROUND

The present disclosure relates to an apparatus and method for pulling a crystal seed from melt for growing a single crystal with concurrent feeding of charge to an annular channel circumscribing the crystal. More particularly, the present disclosure relates to an apparatus and method for heating the annular channel.

TECHNICAL FIELD

A known apparatus for pulling a seed crystal from melt by the Czochralki method comprises an airtight chamber having water-cooled walls and is described in U.S. Pat. No. 4,203,951, filed on Nov. 23, 1977, the entire contents of which are incorporated herein by reference. The bottom part of the chamber accommodates a crucible having its vertical axis generally coinciding with the vertical axis of the chamber. The crucible is mounted on a vertically extending rotary rod which is sealingly received in the chamber through the bottom wall thereof, the rod axis coinciding with the crucible axis.

A heater surrounded by heat insulation is arranged to embrace the crucible. The top part of the chamber accommodates a vertically extending rotary rod having its axis coinciding with the crucible axis. The rod is sealingly received in the chamber through its cover plate and is axially movable. The lower end of the rod supports a seed crystal holder, and the upper rod is coupled to means for imparting thereto a rotary motion and axial reciprocations.

The crucible is provided with an inner container mounted coaxially within an outer container to define an annular channel therebetween to which charge is fed. A bottom and outside wall of the annular channel are defined by a bottom wall and outside wall of the outer container, respectively. An inside wall of the annular channel is formed by an outside wall of the inner container. The outside wall of the inner container is provided with apertures for overflow of melt from said annular channel into the inner container. A bottom wall of the inner container is positioned below the bottom wall of the outer container, so that the inner container protrudes downwards relative to the outer container. The melt is contained in the protruding portion of the inner container. The apertures in the wall of the inner container are arranged at about the level of the bottom wall of the outer container.

A first heater is mounted under the bottom wall of the outer container, and a second heater is located under the bottom wall of the inner container. The apparatus is further provided with a charge feed tube for feeding additional starting material in a molten state to the annular channel for maintaining a controlled level of the melt in the inner container.

A single crystal is grown in the following manner. Starting material is melted in the crucible, and the rod carrying the seed crystal is lowered until it comes in contact with the melt. After the lower end face of the seed crystal is partially melted, the melt temperature is lowered to such an extent that the seed crystal would not be melted any more. Then the rod carrying the seed crystal is slowly pulled, and a single crystal grows on the seed crystal.

Producing single crystals with pre-set properties and perfect crystalline structure requires compliance with a number of rigorous conditions, such as provision of stability and axial symmetry of the thermal field within the growing single crystal and the surrounding melt, maintenance of a pre-set rate of growth and preselected shape of solid-liquid interface, and insurance of stability of the diameter of the growing single crystal. Accordingly, the additional charge feed is introduced to the annular channel where it melts and flows into the inner container for ensuring a stable level of the melt in the inner container for maintaining stability of thermal fields in the single crystal being grown and in the melt.

However, due to various factors, such as unwanted distribution of the cooling effect of the water cooled walls of the chamber or changes in heat distribution as the crystal ingot grows and absorbs varying amounts of heat, cold spots may develop on the bottom wall of the annular channel which interfere with melting of the charge feed. Other factors may interfere with the melting of the introduced charge feed in the annular channel, such as an uneven flow of introduced charge feed, e.g., due to human or mechanical error, or compromise of a vacuum established within the airtight chamber. When the charge feed introduced into the annular channel does not melt completely the annular channel is susceptible to the formation of a condensate thereon, as such condensate may form on cool surfaces and build up rapidly. Once condensate formation has commenced, the condensate accumulates rapidly. Moreover, the condensate can act as a thermal insulator and quickly upset the heat distribution within the growth zone of the crystal, and further physically block the passage of charge feed powder and liquid.

Accordingly, a need exists for an apparatus and method which promotes melting of charge feed introduced into the annular channel and eliminates or minimizes the formation of condensate within the annular channel.

SUMMARY

In one embodiment of the present disclosure, an apparatus is provided for pulling a crystal seed from melt for growing a single crystal. The apparatus includes a sealed chamber and a crucible disposed within the sealed chamber, including an outer container and an inner container disposed substantially coaxially in the outer container. A protruding portion of the inner container protrudes downward relative to the outer container for containing melt, the inner and outer containers defining an annular channel therebetween which has a bottom wall and contains introduced charge feed, wherein means are provided for allowing fluid communication between the annular channel and the inner container. The apparatus further includes at least one charge feed tube having a first and second end portion, wherein additional charge feed is introduced through the charge feed tube via an opening in the first end portion and delivered to the annular channel via an opening in the second end portion, and a heater device disposed within the annular channel for generating heat in order to prevent the formation of a condensate of the charge feed within the annular channel.

In another embodiment of the present disclosure, a method is provided for pulling a crystal seed from melt for growing a single crystal. The method includes the steps of providing a crucible and providing within the crucible an outer container, and providing substantially coaxially within the outer container an inner container. A protruding portion of the inner container protrudes downward relative to the outer container for containing melt, the inner and outer containers defining an annular channel therebetween which has a bottom wall and contains introduced charge feed. The method further includes the steps of providing for allowing fluid communication between the annular channel and the inner container, delivering charge feed into the annular channel, and generating heat from within the annular channel for preventing the formation of a condensate of the charge feed within the annular channel.

In yet another embodiment of the present disclosure, an apparatus is provided for growing a crystal. The apparatus includes a crucible including an outer container encapsulating an inner container, the inner and outer containers defining an annular channel therebetween, and means for heating disposed within the annular channel.

BRIEF DESCRIPTION OF THE DRAWINGS

Various embodiments of the invention will be described herein below with reference to the figures wherein.

DETAILED DESCRIPTION

An apparatus is provided for growing crystals by pulling a crystalline seed from a raw crystal material, and may effectively be used in growing oriented large-sized single crystals of large length and diameter from melt. Exemplary large-sized crystals which may be grown according to the described apparatus include optical and scintillation alkali halide single crystals, and semiconductor single crystals (germanium, silicon). The apparatus includes a chamber within which are disposed inner and outer concentric containers forming an annular channel there between, the annular channel having a bottom wall. The containers and the annular channel surround a crucible within which the crystalline seed is supported. At least one charge feed tube is provided for feeding charge feed, such as NaI powder, into the annular channel. Means are provided for allowing fluid communication between the annular channel and the inner container, allowing the charge feed to flow once it is melted from the annual channel to the inner container.

The at least one charge feed tube is provided with a conductive surface which is in electrical communication at one end with a current source and at the other end with a heater device and forming a circuit for actuating the heater device. The heater device which lies inside of the annular channel warms the annular channel and the introduced charge feed. The warming is effected by radiating heat and without contacting the walls of the annular channel or the charge feed. The warming of the annular channel charge feed tube(s) prevents or minimizes formation of a condensate, such as a NaI condensate, on the bottom or side walls of the annular channel or on the surface of the charge feed tube(s). Buildup of the condensate may interfere with rotation imparted on mobile elements of the apparatus and maintenance of proper thermal conditions for growing the crystal.

Figure 1:
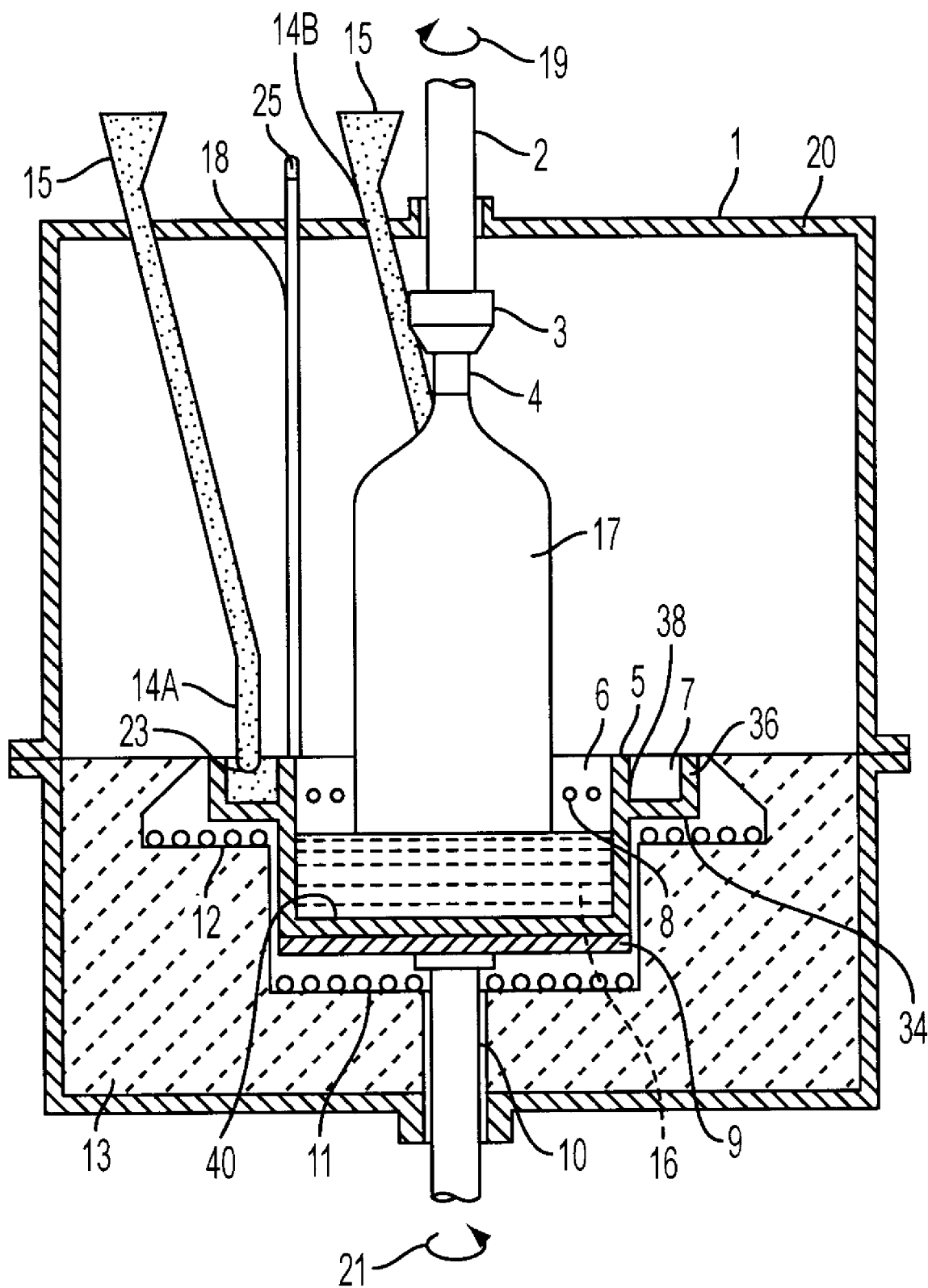
FIG. 1 is a vertical cross-sectional view of an apparatus for growing a crystal in accordance with the present disclosure.
Figure 2:
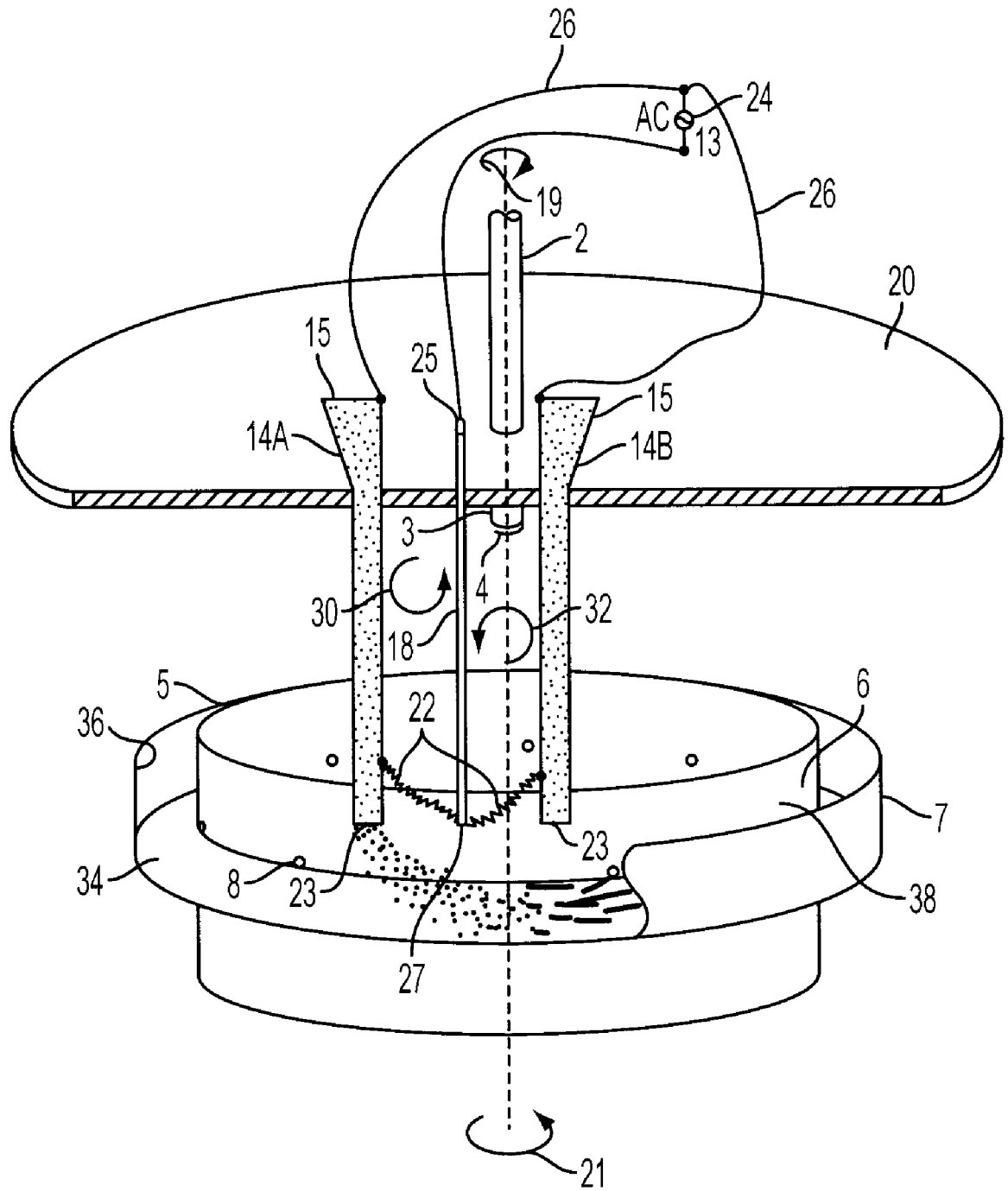
FIG. 2 is a perspective vertical cross-sectional view of a portion of the apparatus shown in FIG. 1, showing a portion of the interior of an annular channel of the apparatus.

Referring to FIGS. 1 and 2, an exemplary apparatus for growing crystals in accordance with the present disclosure is illustrated and designated generally by reference numeral 100. The apparatus comprises an airtight chamber 1 receiving a rod 2 carrying a holder 3 of a seed crystal 4. Each component which passes through a wall of the chamber 1 must include an airtight seal at the location of the wall for maintaining the chamber 1 airtight. A crucible 5 provided within the chamber 1 includes an inner container 6 and an outer container 7. Inner container 7 is mounted on a support 9 rigidly secured to a rod 10. Outer container 7 is supported by inner container 6, with outer container 7 mounted substantially coaxially about inner container 6.

An annular channel is defined between the inner and outer containers. A bottom wall 34 and outside wall 36 of the annular channel are defined by a bottom wall and outside wall of the outer container, respectively. An inside wall 38 of the annular channel is formed by an outside wall of the inner container 6. The outside wall of the inner container 6 is provided with apertures 8 for allowing overflow of introduced melted charge feed from the annular channel into the inner container 6. A bottom wall 40 of the inner container 6 is positioned below the bottom wall of the outer container 7, so that the inner container 6 protrudes downwards relative to the outer container 7. Melt 16 is contained in the protruding portion of the inner container 6.

A first rotation means (not shown) is provided for rotating rod 2, seed 4 and crystal 17 in a first direction designated by arrow 19. A second rotation means (not shown) is provided for rotating rod 10 and crucible 5 in a second direction designated by arrow 21. In the preferred embodiment shown, a first heater 11 for the inner container 6 is disposed under the support 9, and a flat annular second heater 12 is disposed under the bottom wall of the outer container 7. The first and second heaters 11 and 12 are mounted on a pedestal 13 made of heat insulating material and are independently controlled.

At least one charge feed tube 14 having a spout 15 for receiving charge feed is secured near its spout 15 by a top cover 20 of the chamber 1. In the present example, first and second charge feed tubes 14A and 14B, respectively, are shown. The at least one tube 14 depends downwardly through the interior of the chamber 1 and into the annular channel for feeding a comminuted charge through it's bottom end 23 into or towards the annular channel. The vertical axis of the lower portion of each tube 14 is located about in the middle of the annular channel without touching the walls of the inner or outer containers 6 and 7. The bottom end 23 of each tube 14 lies either in a plane of an upper end 36 and 38 of the annular channel or slightly below it. The charge feed tubes 14 remain stationary even when the rods 2 and 10 are rotated.

A third heater 22 including at least one heater device is provided within the annular channel for promoting melting of charge feed introduced into the annular channel and for preventing or minimizing the formation and buildup of condensate within the annular channel. In the example shown, the third heater 22 includes a resistive heat element which operates on current conducted by the conductive charge feed tubes 14A and 14B and an additional conductive lead 18. The third heater 22 may alternatively (or in addition) include another type of heater device, such as a radio frequency, microwave or laser heater device.

Where the third heater 22 is a resistive heater it generates heat which is radiated within the annular channel for heating the space within the annular channel, the walls of the annular channel (including the bottom wall 34), and the introduced charge feed. Any cold spots which may have formed on the walls of the annular channel will be warmed and the introduced charge feed is melted, even if unusual circumstances develop, such as an increased flow of introduced charge feed.

In the present example the charge feed tubes 14A and 14B protrude from the chamber 1 and the respective protruding portions are in electrical communication via leads 26 with a controlled current source 24 that is external to the chamber 1. A circuit is formed with the conductive charge feed tubes 14A and 14B and the third heater 22 and an at least one conductive lead 18, thus providing current to the third heater 22 in order to actuate the third heater 22. There are a variety of ways in which current may be provided to the third heater 22, and the disclosure is not limited to the embodiment shown. For example, the charge feed tubes 14A and 14B may be excluded from the circuit, and two or more conductive leads 18 may be provided for the purpose of providing current to the third heater 22. In another example, a circuit for providing current to the third heater 22 is formed by connecting the third heater 22 between the two charge feed tubes 14A and 14B, each of which are in electrical communication with the current source, without including any additional conductive leads 18.

Conductive lead 18 having a top and bottom end, 25 and 27, respectively, is secured near its top end 25 by the top cover 20 of the chamber 1 and depends downwardly through the interior of the chamber 1 and into or toward the annular channel. The top end 25 protrudes from the chamber 1 and is in electrical communication with the current source 24, and the bottom end 27 is in electrical communication with the third heater 22. A circuit is formed in which a first current flow 30 is established which flows from the current source through the charge feed tube 14A, the third heater 22 and the conductive lead 18, and a second current flow 32 flows from the current source through the charge feed tube 14B, the third heater 22 and the conductive lead 18. If one of the current flows 30 or 32 is obstructed, such as due to a grounding of one of the charge feed tubes 14A or 14B and/or a short circuit, the other current flow will still be operative.

A control unit (not shown) having a processing device, such as a microcontroller, may be provided for controlling the current source 24 for controlling current flow to the third heater 22. Accordingly, the control unit controls actuation of the heater 22 and the degree of heat generated by the third heater 22. For example, if a buildup of condensate is sensed in the annular channel the control unit may increase the amount of heat generated by the third heater 22. As the ingot crystal increases and absorbs more heat the amount of heat generated by the third heater 22 may be increased.

Using the charge feed tubes 14A and 14B to conduct current to the third heater 22 provides the advantage of minimizing the number of additional components, and in particular the number of components which pass through the wall of the chamber 1 which must be kept air tight. Each component which breaches a wall of the chamber must be properly sealed and introduces a risk of a break in the seal. Accordingly, the embodiment shown in FIG. 2 provides two independent current paths, where one can act as a backup for the other, and minimizes the number of components and particularly the number of components which breach a wall of the chamber 1.

The charge feed tubes 14A and 14B remain stationary when the crucible 5 and the crowing crystal 17 are rotated. The charge feed introduced to the annular channel moves in a downstream direction relative to the charge feed tubes 14A and 14B due to the rotation. The charge feed tubes, the third heater 22 and the conductive lead 18 may be placed strategically to maximize the warming effect of the heat generated by third heater 22. For example, the heater devices of the third heater may be positioned downstream from at least one of the charge feed tubes 14A and 14B. In an example not shown, it is possible to place an additional heater device of the third heater 22 downstream from charge feed tube 14B, even by providing an additional conductive lead 18.

The apparatus according to the invention functions in the following manner. Prior to the operation, starting charge is charged in the inner container 6 of the crucible 5 in an amount such that after its melting the column of melt 16 should not exceed the height of the bottom wall of 34 of the outer container 7. The seed crystal 4 is fixed to the holder 3, and means for rotation, e.g., rotary drives (not shown), of the rods 2 and 10 are activated. Then the heaters 11 and 12 are energized, and the starting charge is melted. The temperature of the heater 12 is then maintained constant, and the temperature of the melt 16 is set to be nearly equal to the crystallization temperature of the starting material by means of the heater 11.

The seed crystal 4 is slowly lowered until it comes in contact with the melt 16. After the seed crystal 4 is partially melted, and an equilibrium is established between the seed crystal 4 and the melt 16 (there should be neither melting nor crystallization on the seed crystal 4), the drives are energized to lift the rod 2 and the holder 3 of the seed crystal 4, as well as the drive for feeding charge to the annular channel via the charge feed tube 14. Further, the rate of pulling is maintained constant and the temperature of the bottom heater 11 is controlled so that a single crystal 17 of desired diameter grows on the seed crystal 4. At the stage of growing of single-crystal 17 from the seed crystal 4 to a pre-set final diameter, the rate of charge being fed to the funnel 15 is gradually increased in accordance with the increase in the mass rate of growth of the single crystal 17 enlarging in diameter. After the pre-set final diameter is achieved, the feeding rate is then maintained at constant level.

With maintenance of the same mass rates of growth and of feeding at all stages of the growing process, the level of the melt 16 in the crucible 5, hence the solid-liquid interface, does not change its position relative to the heaters 11, 12 and crucible 5 thus ensuring a stable thermal field at the interface.

The third heater 22 is activated for warming the annular channel to maintain the regulated flow of melted charge feed for stabilizing the level of the melt and the thermal field. Furthermore, the warming of the annular channel prevents or minimizes the formation of condensate which would interfere with the flow of the melted charge feed, the stabilization of the thermal field and/or the rotation of the rods 2 and 10.

From the foregoing and with reference to the various figure drawings, those skilled in the art will appreciate that certain modifications can also be made to the present disclosure without departing from the scope of the same. While several embodiments of the disclosure have been shown in the drawings, it is not intended that the disclosure be limited thereto, as it is intended that the disclosure be as broad in scope as the art will allow and that the specification be read likewise. Therefore, the above description should not be construed as limiting, but merely as exemplifications of preferred embodiments. Those skilled in the art will envision other modifications within the scope and spirit of the claims appended hereto.

What is claimed is:

1. An apparatus for pulling a crystal seed from melt for growing a single crystal, the apparatus comprising:

a sealed chamber;

a crucible disposed within the sealed chamber including an outer container and an inner container disposed substantially coaxially in the outer container, wherein a protruding portion of the inner container protrudes downward relative to the outer container for containing melt, the inner and outer containers defining an annular channel therebetween which has a bottom wall and contains introduced charge feed, wherein means are provided for allowing fluid communication between the annular channel and the inner container;

at least one charge feed tube having a first and second end portion, wherein additional charge feed is introduced through the charge feed tube via an opening in the first end portion and delivered to the annular channel via an opening in the second end portion; and a heater device disposed within the annular channel above the bottom wall thereof, for generating heat proximal a top surface of the charge feed, in order to prevent the formation of a condensate of the charge feed within the annular channel.

2. The apparatus according to claim 1, wherein the heater device is powered by electrical current, and a conductive charge tube of the at least one charge feed tubes includes a conductive material which conducts current to the heater device.

3. The apparatus according to claim 1, wherein the heater device is a resistive heater device.

4. The apparatus according to claim 1, wherein the at least one charge feed tube includes first and second charge feed tubes each formed at least in part by a conductive material, wherein an electrical circuit is formed including the conductive material of the first and second charge feed tubes, a controlled current source, and the heater device for providing current to the heater device for activating the heater device.

5. The apparatus according to claim 1, further comprising at least one conductive lead conducting current to the heater device for activating the heater device.

6. The apparatus according to claim 2, wherein the conductive portion of the conductive charge feed tube extends externally from the chamber and is in electrical communication with a current source provided externally from the chamber for delivering current to the heater device.

7. The apparatus according to claim 4, further comprising at least one conductive lead having a first and second end conducting current to the heater device, wherein:
   the first end of the conductive lead and the conductive material of the first and second charge feed tubes each extend externally from the chamber and are in electrical communication with a current source provided externally from the chamber; and
   the second end of the conductive lead and the conductive material of the first and second charge feed tubes are each in electrical communication with the heater device forming a circuit having at least a first and second circuit path, wherein if current flow is interrupted along one of the first and second circuit paths the current flow remains intact in the other of the first and second circuit paths.

8. The apparatus according to claim 1, further comprising means for rotating the crucible, wherein:
   the at least one charge feed tube remains stationary when the crucible is rotated and the charge feed introduced to the annular channel moves in a downstream direction relative to the charge feed tubes due to the rotation; and
   the heater device is positioned downstream from at least one of the charge feed tubes.

9. The apparatus according to claim 1, wherein the heater device further heats the introduced charge feed by radiation only.

10. A method for pulling a crystal seed from melt for growing a single crystal, the method comprising:
   providing a crucible;
   providing within the crucible an outer container;
   providing substantially coaxially within the outer container an inner container, wherein a protruding portion of the inner container protrudes downward relative to the outer container for containing melt, the inner and outer containers defining an annular channel therebetween which has a bottom wall and contains introduced charge feed;
   providing for allowing fluid communication between the annular channel and the inner container;
   delivering charge feed into the annular channel; and
   generating heat proximal a top surface of the charge feed, from within the annular channel above the bottom wall thereof, for preventing the formation of a condensate of the charge feed within the annular channel.

11. The method according to claim 10, wherein the charge feed is delivered via at least one charge feed tube and the heating is generated by a heater device, the method further comprising the step of conducting current to the heater device via at least one charge feed tube of the at least one charge feed tube.

12. The method according to claim 11, wherein the conducting current to the heater device is further performed via a conductive lead other than the at least one charge feed tube.

13. The method according to claim 10, wherein the generating the heat further heats the introduced charge feed by radiation only.

14. An apparatus for growing a crystal, the apparatus comprising:
   a crucible including an outer container encapsulating an inner container, the inner and outer containers defining an annular channel therebetween, said annular channel defining a bottom wall; and
   means for generating heating proximal a top surface of the charge feed, disposed within the annular channel above the bottom wall thereof.

15. The apparatus according to claim 14, wherein the inner container holds melt and the annular channel is in fluid communication with the inner container.

16. The apparatus according to claim 15, wherein the apparatus further comprising means for introducing charge feed to the annular channel, wherein the introduced charge feed is heated by the means for heating.

17. The apparatus according to claim 16, wherein the means for delivering charge conducts current to the means for delivering heat for activating the means for delivering heat.

18. The apparatus according to claim 17, further comprising additional means for conducting current to the means for delivering heat besides the means for delivering charge.

19. The apparatus according to claim 16, wherein the means for delivering heat further heats the introduced charge feed by radiation only.

20. The apparatus according to claim 14, wherein the means for heating is a device selected from the group of devices consisting of: a radiofrequency heater device, a microwave heater device, a laser heater device and a resistive heater device.

* * * * *